(12) United States Patent
Wetzel et al.

(10) Patent No.: US 8,792,242 B2
(45) Date of Patent: Jul. 29, 2014

(54) CONTROL UNIT HOUSING

(75) Inventors: Gerhard Wetzel, Korntal-Muenchingen (DE); Helmut Deringer, Erligheim (DE); Ulrich Trescher, Tuebingen (DE); Hans-Dieter Siems, Eberdingen (DE); Eckhard Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 405 days.

(21) Appl. No.: 12/735,137

(22) PCT Filed: Nov. 27, 2008

(86) PCT No.: PCT/EP2008/066283
§ 371 (c)(1),
(2), (4) Date: Oct. 14, 2010

(87) PCT Pub. No.: WO2009/077300
PCT Pub. Date: Jun. 25, 2009

(65) Prior Publication Data
US 2011/0044005 A1 Feb. 24, 2011

(30) Foreign Application Priority Data
Dec. 19, 2007 (DE) .......................... 10 2007 061 116

(51) Int. Cl.
*H05K 7/20* (2006.01)
(52) U.S. Cl.
USPC .......................................... 361/707; 361/714
(58) Field of Classification Search
USPC .............................. 361/714, 679.01, 704, 707
See application file for complete search history.

(56) References Cited

U.S. PATENT DOCUMENTS

| | | | | |
|---|---|---|---|---|
| 4,240,524 A * | 12/1980 | Katayama et al. | ............ | 184/6.12 |
| 4,713,714 A * | 12/1987 | Gatti et al. | .................... | 360/137 |
| 5,532,430 A * | 7/1996 | Lanoe | ............................ | 174/541 |
| 5,590,026 A * | 12/1996 | Warren et al. | ................. | 361/704 |
| 5,709,134 A * | 1/1998 | Ulm | .............................. | 74/606 R |
| 5,940,279 A * | 8/1999 | Gademann et al. | ............ | 361/823 |
| 6,028,770 A * | 2/2000 | Kerner et al. | ................. | 361/704 |
| 6,318,451 B1 * | 11/2001 | Lee et al. | ..................... | 165/80.3 |
| 6,570,773 B1 * | 5/2003 | Loibl et al. | ..................... | 361/752 |
| 6,920,052 B2 * | 7/2005 | Callahan et al. | .............. | 361/767 |
| 7,050,305 B2 * | 5/2006 | Thorum | ......................... | 361/719 |
| 7,193,852 B2 * | 3/2007 | Wetzel | ............................ | 361/714 |
| 7,236,368 B2 * | 6/2007 | Maxwell et al. | .............. | 361/719 |
| 7,441,590 B2 * | 10/2008 | Yano et al. | ..................... | 165/80.2 |
| 7,813,111 B2 * | 10/2010 | Anderson et al. | ............. | 361/674 |
| 7,973,437 B2 * | 7/2011 | Feier et al. | ...................... | 310/64 |
| 8,537,540 B2 * | 9/2013 | Landon | .................... | 361/679.54 |
| 2001/0015887 A1 * | 8/2001 | Sanada et al. | ................. | 361/704 |
| 2003/0063442 A1 * | 4/2003 | Kimoto et al. | ................ | 361/704 |

(Continued)

FOREIGN PATENT DOCUMENTS

| DE | 196 40 466 | 4/1998 |
|---|---|---|
| DE | 199 07 949 | 9/2000 |

(Continued)

*Primary Examiner* — Adrian S Wilson
(74) *Attorney, Agent, or Firm* — Kenyon & Kenyon LLP

(57) ABSTRACT

A control unit housing, especially for a transmission control module of a transmission of a motor vehicle. The control unit housing includes a first housing part and a second, cover-shaped housing part. A circuit carrier having at least one electronic component is accommodated in the first housing part. The first housing part is designed in the shape of a tub, whose floor is designed as a heat dissipation surface to an additional housing.

15 Claims, 3 Drawing Sheets

(56) References Cited

U.S. PATENT DOCUMENTS

| | | | |
|---|---|---|---|
| 2003/0133267 A1* | 7/2003 | Beihoff et al. | 361/704 |
| 2003/0214787 A1* | 11/2003 | Liu | 361/704 |
| 2004/0057221 A1* | 3/2004 | Callahan et al. | 361/771 |
| 2005/0088827 A1* | 4/2005 | Zhang | 361/720 |
| 2005/0111193 A1* | 5/2005 | Lee et al. | 361/704 |
| 2005/0190539 A1* | 9/2005 | Watanabe et al. | 361/704 |
| 2006/0023426 A1* | 2/2006 | Murakami et al. | 361/715 |
| 2006/0268508 A1* | 11/2006 | Lee | 361/687 |
| 2007/0195503 A1* | 8/2007 | Xue et al. | 361/714 |
| 2008/0024996 A1* | 1/2008 | Jacobson et al. | 361/714 |
| 2008/0165489 A1* | 7/2008 | Ho et al. | 361/684 |

FOREIGN PATENT DOCUMENTS

| | | |
|---|---|---|
| DE | 103 40 974 | 3/2005 |
| DE | 10 2004 061 818 | 7/2006 |
| DE | 10 2005 063 280 | 7/2007 |
| EP | 1 841 303 | 10/2007 |
| JP | 2005-300426 | 10/2005 |
| JP | 2006-36147 | 2/2006 |
| WO | WO 2005/025940 | 3/2005 |
| WO | WO 2007/077144 | 7/2007 |

* cited by examiner

CONTROL UNIT HOUSING

BACKGROUND OF THE INVENTION

1. Field of the Invention

The present invention relates to a control unit housing, especially for a transmission control module of a transmission of a motor vehicle.

2. Description of Related Art

In transmission control modules for transmissions of motor vehicles, hybrid control units, sensors and at least one plug connection for connecting the transmission control module are used these days on a vehicle cable harness of a motor vehicle. The plug connection for connecting to the cable harness is also designated as transmission plug. The transmission control modules mentioned are currently used while using ATF (automatic transmission fluid), and are exposed to very high temperature fluctuations from a temperature of −40° C. to 150° C. in the vehicle transmission. In order to protect the sensitive electronics deployed in the transmission control module from the aggressive transmission fluid (ATF=automatic transmission fluid), the aim is to accommodate the electronics in a sealed housing. In order to assure sufficient heat dissipation for the electronic components of the transmission control module, in view of the high operating temperatures mentioned, the metallic base area of the control unit housing of the transmission control module is placed against the aluminum housing of a transmission hydraulics system. This means that the metallic base area of the control unit housing contacts the aluminum housing of the transmission hydraulics system, whereby heat dissipation of the waste heat by thermal conduction takes place.

One specific embodiment of a transmission control module that is already in production includes a hermetically sealed control unit housing for an electronic circuit. The hermetically sealed control unit housing itself is made up of a steel base plate that is developed to be flat, and has glazed metal pins, which makes possible the electrical contacting between the circuit and the lead frame using bonding, and a steel cover, which is tightly welded to the base plate. The electrical connection of the glazed metal pin to the sensors and plugs of the electronics module takes place by way of the lead frame. The lead frames are welded onto the glazed pins. Since the glazed pins project perpendicularly from the base plate of the control unit, it is necessary for the contact surface of the transmission hydraulics, required for heat dissipation, to form an elevated area.

Published German patent document DE 196 40 466 B4 describes a metallic substrate part for electronic components or a circuit substrate, as well as a method for producing same. Published German patent document DE 196 40 466 B4 describes a hermetically sealed housing in which the glazed metal pins are not directly glazed into the floor part of the control unit housing, but into two separate parts. The two separate parts are also designated as pin strips, which after their production are welded into the floor plate. This technique has the advantage that only the small pin strips have to be heated during glazing, but the large floor plate does not have to be exposed to the high temperatures that occur during glazing.

One additional specific embodiment of an electronics module, that is currently in mass production, having a sealed control unit housing, is made available based on a flexible printed circuit (FPC=flexible printed circuit) adhered onto an aluminum plate. Published German patent document DE 199 07 949 A1 describes the function of the sealed control unit housing.

A flexible printed circuit board, made, for example, of a polyimide foil, adhesive, copper, adhesive, polyimide foil, is connected by continuous material to the electronic components on a circuit carrier (LTCC), for instance, adhered on. From the LTCC, bonding is carried out directly to the flexible printed circuit board. Onto the flexible printed circuit board, in turn, a plastic cover is laid having an elastomer seal inserted into it, and is rigidly connected to the aluminum plate, for instance, using a riveting connection. In this case, the heat dissipation also takes place to the housing of the transmission hydraulics system. However, because of the planar construction of the control unit housing, no raised area is necessary as was in the design approach according to published German patent document DE 196 40 466 B4.

Published German patent document DE 10 2004 061 818 A1 relates to a control module. In this design approach, a control module is proposed for a transmission of a motor vehicle, which includes a carrier part. On the carrier part there is situated a control unit which has a first housing part and a second housing part and an internal housing chamber situated between the first housing part and the second housing part. At least one flexible conductor foil is provided, which is used for the electrical connection of the circuit part having electrical components that are situated outside the housing inner chamber. The control unit is situated having the first housing part lying on a contact area of the carrier part. The second housing part is situated within the contact area at the first housing part.

BRIEF SUMMARY OF THE INVENTION

Following the design approach proposed according to the present invention, a control unit housing is provided which has a metallic part in the shape of a tub-shaped base form, as well as a cover which is preferably made of steel, the two metallic parts mentioned, that is, the tub-shaped base form and cover, being able to be connected to each other using continuous material, such as being welded together. The contact pins, for the electrical contacting, are glazed directly into the base form, i.e. the tub-shaped component. The design approach provided according to the present invention is distinguished by a superlative evenness of the floor plate. This creates only slight gaps between the circuit carrier and the floor plate, and between the floor plate and the transmission hydraulics housing, which in turn ensures good heat dissipation. Following the provided design approach according to the present invention, the contact pins are situated in such a way that a "wire bond" may be set onto the end face of the contact pins, for the contacting. The design approach provided according to the present invention also offers the possibility of absorbing, via a strain relief, mechanical forces, such as vibrations, oscillations and expansions that are caused thermally, which may occur during operation, so that the electrical contacting of contact pin to lead frame, which is produced within the scope of the laser welding for the continuous material connection, may be kept to the greatest extent free from mechanical stresses. Furthermore, the design approach, provided according to the present invention, has the advantage that it may be installed modularly, in different variants of electronics modules, and not only on particularly stressed transmissions or the like.

The insertion of the contact pins ensuring the electrical contacting takes place directly by way of the glazing into the base form. The use of materials such as metal and glass, as well as welding, as the continuous material joining method used, and the glazing process of the contact pins make it possible to produce a hermetically sealed, cost-effective housing, using robust, proven processes.

In particular, the tub-like base form inserted has a very high structural rigidity. Because of this, it is possible to fasten the contact pins directly in the tub-shaped base form by way of the process step of glazing it in, without the floor area of the tub-shaped base form warping in an inadmissible manner in this processing at high temperatures, and without damage being done to its dimensional accuracy. Consequently, one may do completely without welding the pin strips into the floor plate, as had been described according to published German patent document DE 196 40 466 B4. Because of the structural rigidity that goes along with the tub shape, no raised area is required to ensure heat dissipation by way of heat conduction. The area for the mechanical fixing of the transmission control module, that is the screw-on surface as well as the area required for the heat dissipation, represent a plane, so that the housing of the transmission hydraulics is able to be designed to be planar in a simple manner, which has a favorable influence on its production costs.

The edge of the essentially tub-shaped base form is executed in such a way that individual regions having bores are larger than the cover that closes off the base form. The enlarged edge of the base form gives the possibility of fixing the lead frames mechanically to the control unit housing, for instance, by having plastic plugs extruded onto the lead frame plugged through the bores in the edge and subsequently being able to rivet them there. Strain relief of the lead frame is achieved thereby, so that the electrical contacting between lead frame and contact pin, which is able to be joined by way of laser welding to the base part, for example, is not exposed to any mechanical stresses. In addition, one may thus produce an easily manipulable subassembly of control unit/lead frame, which is advantageous with respect to production.

The mechanical fastening of the control unit housing takes place by applying a force acting perpendicularly on the cover. The force acting perpendicularly on the cover may be implemented by a spring, for example. On the one hand, this offers the possibility of fixing the control unit housing mechanically, and on the other hand, of achieving an optimal contact pressure for the heat dissipation, via the contact pressure thus executed, at a minimum development of gaps which, as seen overall, favorably influences the heat transport via heat conduction.

Because of the essentially tub-shaped structure of the base form of the control unit housing, it is possible to arrange the glazed-in, pin-shaped contact pins perpendicular to the circuit carrier. This achieves an advantageous arrangement for undertaking the wire bonding between the glazed-in contact pins and the circuit carrier. In so-called hybrid housings having horizontally glazed-in contact pins, it is true that an even connection was also made possible, but in this case, the process step of bonding is very unfavorable. In order to be able to produce a bonding connection in this instance, one would have to impress a flat surface on, in an additional work step. The horizontal arrangement of the contact pins is, in addition, unfavorable for the bonding, since it tends to pivot.

In one further advantageous specific embodiment of the idea on which the present invention is based, it is provided that a metallic block shall be inserted into the tub-shaped base form of the control unit housing, which is preferably made up of a material such as aluminum. The circuit carrier is adhered onto this metallic block. The metallic block is used as a heat distributor, and offers a better dissipation of the heat in the case of particularly hot components. In addition, it is possible, according to this further specific embodiment of the idea on which the present invention is based, to adhere the metallic block into the tub-shaped base form in insulated fashion, and in this way to achieve a highly effective shielding.

BRIEF DESCRIPTION OF THE SEVERAL VIEWS OF THE DRAWING

In the following text the present invention will be explained in greater detail on the basis of the drawings. The figures show.

DETAILED DESCRIPTION OF THE INVENTION

Figure 1:
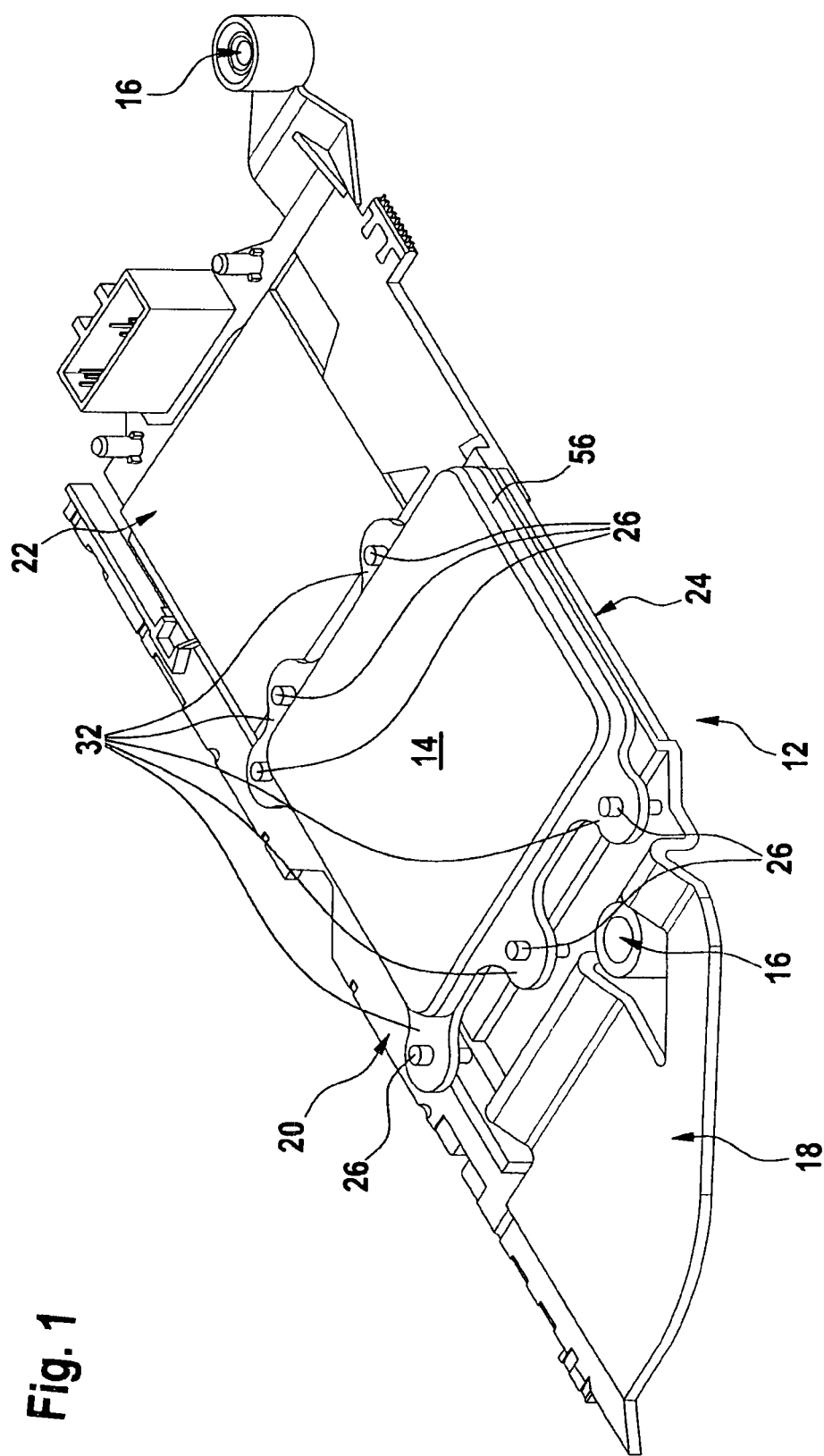
FIG. 1 shows a perspective view of a plurality of lead frames on the transmission control module having a control unit housing.

In a perspective top view, FIG. 1 shows the lead frames that surround the tub-shaped housing part of the control unit housing on the transmission control module.

The mechanical fixing between strain relief tabs 32 and rivetings 26 passing through them and lead frames 18, 20 and 22 takes place in such a way that the actual electrical contacting of contacting pins 36, arranged by glazings 38, in edge region 34 of tub-shaped housing part 24, is decoupled. In glazings 38, which are used for insulation and gastightness, accommodated contact pins 36 are arranged perpendicular with reference to an edge region 34 of tub-shaped housing part 24, which considerably simplifies the development of bonding connections, especially wire bonding.

One may gather from the illustration in FIG. 1 that control unit housing 12 on the transmission control module, especially its tub-shaped housing part 24, has the heat dissipation surface 14, which is designed essentially as an evenly running plane surface. Reference numeral 16 designates individual fastening openings for fastening control unit housing 12 to the transmission control module, using which the latter is able to be fastened to a transmission hydraulic housing 10, that is shown schematically in FIG. 3.

Figure 2:
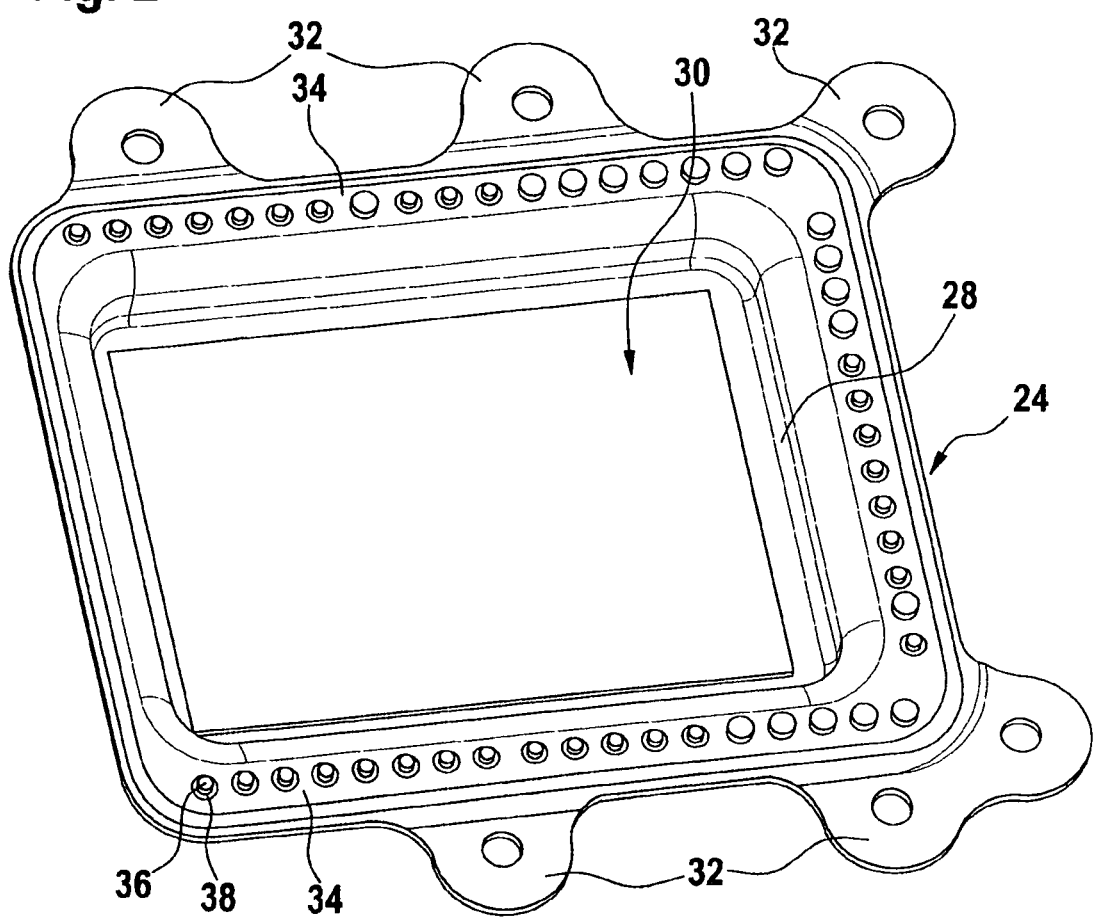
FIG. 2 shows a perspective top view onto a tub-shaped housing part of a control unit housing.

FIG. 2 shows a perspective view of the tub-shaped housing part along with a circuit carrier lying inside it, as well as strain relief tabs situated along the circumference.

FIG. 2 shows that tub-shaped housing part 24 includes an evenly developed floor area, upon which a circuit carrier 30 lies. A sidewall 56 extends perpendicular to the floor area of tub-shaped housing part 24, and it borders on inner side 28 of tub-shaped housing part 24. Edge 34 extends along the circumference of tub-shaped housing part 24. Tub-shaped housing part 24, shown in a perspective view in FIG. 2, may be produced cost-effectively and robustly as a deep-drawn part using sheet steel. Contact pins 36 are situated accommodated in glazings 38 along edge 34. Contact pins 36, which have a pin-shaped aspect, extend perpendicularly, that is, at an angle of 90° to the flat surface of edge 34 of tub-shaped housing part 24. The arrangement of contact pins 36 along edge 34 of tub-shaped housing part 24 may be made at one or several adjacent locations or on one or several sides along edge 34.

The number of contact pins 36 accommodated in glazings 38 in edge 34 may be varied in correspondence to the requirements of the electronic circuit on circuit carrier 30. Circuit carrier 30 is executed, for example, as an LTCC (low temperature co-fired ceramic), and it is adhered onto the floor of tub-shaped housing part 24. Circuit carrier 30 includes the electronic circuit and is equipped with at least one electronic component (see also the sectional illustration according to FIG. 3).

In the illustration according to FIG. 2, strain relief tabs 32 are arranged in a plane along edge 34. The arrangement of strain relief tabs 32 is dependent on the position of lead frames 18, 20, 22, with which tub-shaped housing part 24 is to be fastened.

Figure 3:
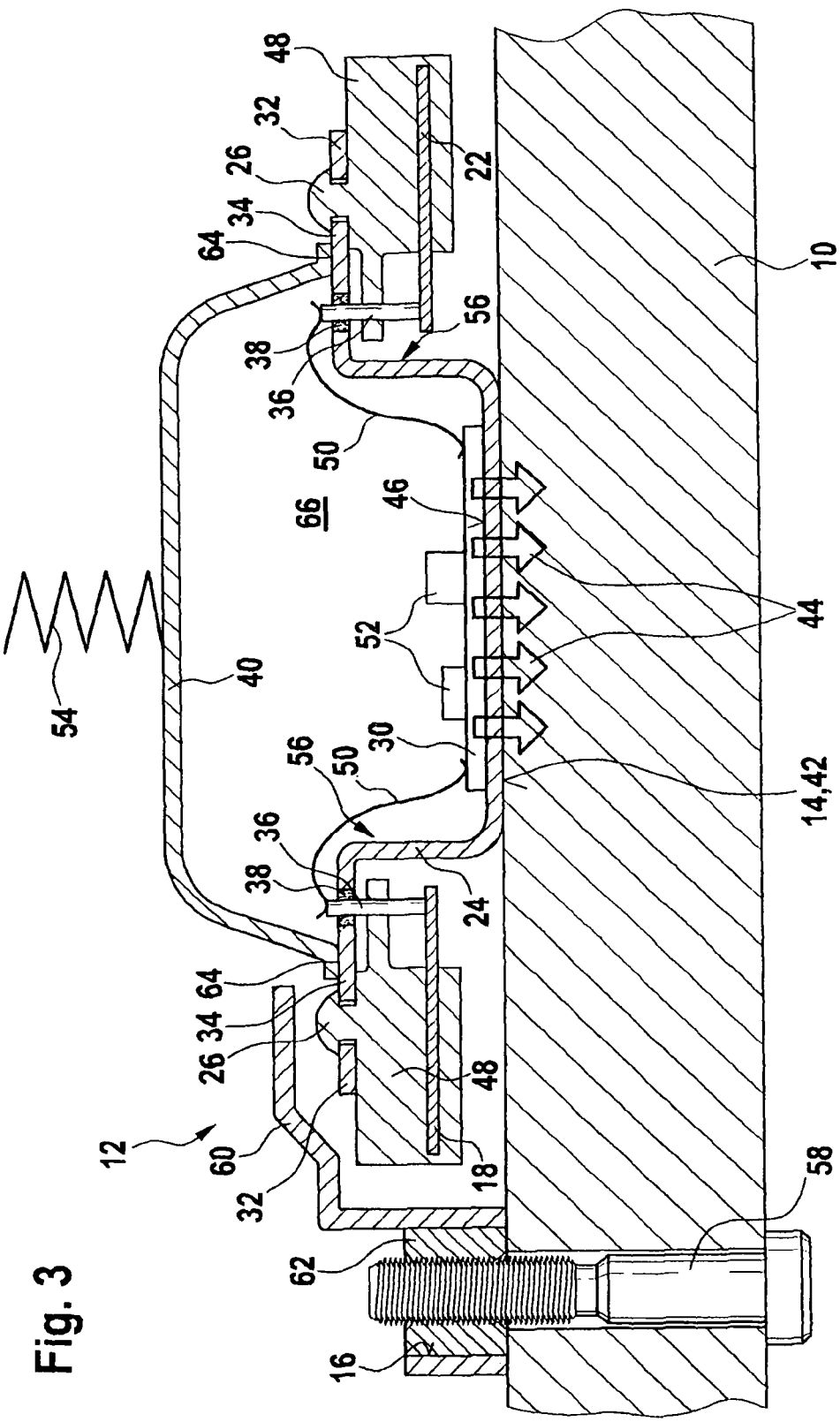
FIG. 3 shows a section through a control unit housing in a state of being placed against a transmission hydraulics housing and making possible heat transportation by heat conduction.

FIG. 3 shows a sectional representation through a control unit housing, whose lower side is contacted to a plane side of a transmission hydraulic housing in a manner favoring the heat conduction.

FIG. 3 shows that heat dissipation surface 14 of tub-shaped housing part 24 is placed, along a contact surface 42, between tub-shaped housing part 24, especially heat dissipation surface 14, against a transmission hydraulic housing 10. The bigger the contact surface, between heat dissipation surface 14, on the lower side of tub-shaped housing part 24, and the evenly designed plane surface of transmission hydraulic housing 10, can be made, the better the heat dissipation 44 that sets in. Furthermore, FIG. 3 shows that in cavity 66, which is developed between tub-shaped housing part 24 and its cover part 40, circuit carrier 30 is equipped with at least one electronic component 52. The lower side of circuit carrier 30 forms a contact surface 46 with the floor area of tub-shaped housing part 24 between circuit carrier 30 and tub-shaped housing part 24. Here, too, it is true that heat conduction 44 is more favorable the bigger contact surface 46 is able to be made between circuit carrier 30 and the inner side of the floor of tub-shaped housing part 24. Heat dissipation 44 is better, the smaller the remaining gap widths between circuit carrier 30 and the upper side of heat dissipation surface 14, and between the lower side, that is, heat dissipation surface 14 of tub-shaped housing part 24 and the upper evenly designed plane side of transmission hydraulic housing 10, are able to be designed.

The at least one circuit carrier 30 accommodates an electronic circuit on its upper side, which includes at least one electronic component 52. The at least one electronic component 52 is electrically contacted to circuit carrier 30, and is adhered onto circuit carrier 30 preferably by wire bonding. Circuit carrier 30 itself is also electrically contacted via bonding connections 50 to contact pins 36 that are developed pin-shaped in glazings 38, in edge 34 of tub-shaped housing part 24. As may be seen from the sectional representation according to FIG. 3, there is play between an extrusion coat 58 of first lead frames 18 and third lead frames 22 and the lateral surface of contact pins 36, that are developed pin-shaped, so that there exists a mechanical decoupling of the pin-shaped developed contact pins 36, and the latter contacts lead frames 18 and 22 only electrically. Mechanical tensile loads are absorbed via strain relief tabs 32, riveting 26 and extrusion coat 58 that in each case surrounds lead frames 18 and 22. Bonding connection 50 between contact pins 36 and circuit carrier 30 is developed in such a way that it is not stressed mechanically by tension or bending or the like.

Tub-shaped housing part 24 is tightly sealed hermetically using a cover part 40. A hermetically sealed connection between tub-shaped housing part 24 and cover part 40 is preferably generated along a sealed edge 64, by a continuous material connection. This ensures a gas tightness of cavity 66 between tub-shaped housing part 24 and cover part 40. The continuous material connection along sealing edge 64 between tub-shaped housing part 24 and cover part 40 is preferably produced by welding. A control unit housing 12 thus developed is now in a position to be tested electrically as a small assembly. In a subassembly thus premounted, both the tightness of inner space 66 is able to be tested, and tests at increased or reduced ambient temperature may be carried out, since the mass and the volume of the construction of control unit housing 12 are small.

As one may see furthermore in the sectional representation in FIG. 3, cover part 40 of control unit housing 12 provided according to the present invention, that is developed as one piece, is placed against the evenly developed plane surface of transmission hydraulic housing 10, using an adjusting spring 54. Based on evenly developed heat dissipation surface 14 and the evenly developed upper side of transmission hydraulic housing 10, an optimal heat introduction 44 is ensured.

Outside hermetically sealed cavity 66 of control unit housing 12, contact pins 36 accommodated in glazings 38 are preferably electrically contacted to one or more lead frames 18, 20, 22 by way of laser welding. One or more sensors or plugs of an electronic module are electrically contacted to lead frames 18, 20, 22. As a fixing possibility, one option is, for example, screw sockets 62, via which fastening elements 58, such as screws, for screwing control unit housing 12 to transmission hydraulic housing 10, may be used.

Fastening openings 16 on control unit housing 12 and heat dissipation surface 14 may be developed in one plane so as to improve the thermal contacting of heat dissipation surface 14.

This permits a simple and cost-effective design of control unit housing 12 for a transmission hydraulic system. Moreover, a very favorable heat dissipation 44 may be implemented, which makes possible a reliable dissipation of the heat loss generated by the at least one electronic component 52.

In a further embodiment of the idea on which the present invention is based, a metallic block may be introduced into tub-shaped housing part 24 of control unit housing 12, which is preferably made of aluminum. On this aluminum block, circuit carrier 30 may be fastened by continuous material, such as being adhered on. The aluminum block may advantageously be used as a heat accumulator or a heat distributor, in order to achieve a better dissipation of the heat loss of a particularly hot electronic component 52, for example. Furthermore, it is possible to insert the block made of metallic material, in insulated fashion, into tub-shaped housing part 24, to adhere it in, for instance, and thus achieve a highly effective shielding. The bigger the metallic block, made for instance of aluminum, is made, the higher is the heat accumulator capacity that can be achieved.

The design approach provided, described above with the aid of FIGS. 1 to 3, in its various embodiment variants, makes it possible to produce a hermetically sealed system, especially including a gastight cavity 66 of a control unit housing 12, a tub-shaped housing part 24 and a cover part 40. Control unit housing 12 includes essentially the two housing parts 24 and 40. Contact pins 36 are accommodated in glazings 38 in tub-shaped housing part 24, cover part 40 being closed hermetically sealed (gastight) to tub-shaped housing part 24 along sealing edge 64 by way of a continuous material connection, that is, a robust process, such as welding. Tub-shaped housing part 24 and cover part 40 may be produced cost-effectively as deep drawn components. Because of the tub shape of housing part 24, it is possible to place circuit carrier 30 or the metallic block used as heat accumulator against an evenly developed plane surface of transmission hydraulic housing 10, to fix it there, and at the same time to assure at this area, too, the thermal contacting of control unit housing 12. Enlarged edge 34 of tub-shaped housing part 24 offers the possibility of connecting lead frames 18, 20, 22, which electrically contact the control unit, to control unit housing 12 in such a way that mechanical strain relief for the electrical contacting 50, 36 is able to be achieved by strain relief tabs 32.

The essentially pin-shaped contact pins 36 are able to be accommodated in glazings 38, since the tub shape of housing part 24 has a very great structural rigidity. This avoids warping of the thermal contact surface, i.e. of contact surfaces 42 and 46, as described above. Moreover, because of the design approach provided according to the present invention, especially by the tub-shaped embodiment of housing part 24 of control unit housing 12, it may be achieved that a perpendicular arrangement of pin-shaped contact pins 36 is performed, which makes possible advantageous wire bonding having little pivoting. The compact design of control unit housing 12, provided according to the present invention, additionally makes possible a simple functioning test, even at higher temperatures, as well as extremely simple handling. Control unit housing 12, developed essentially as a modular unit, may also be used as a control unit in applications other than the above transmission application.

What is claimed is:

1. A control unit housing, comprising:
   a first housing part in the shape of a tub formed from a single piece of sheet steel having an evenly running planar floor area designed as a heat dissipation surface between two objects contacting opposite sides of the planar floor area and having an edge extending along a circumference of the first housing part that includes at least one strain relief tab for absorbing mechanical tensile loads when fastened to an extrusion,
   a second, cover-shaped housing part, and
   a circuit carrier having at least one electronic component and affixed directly to the evenly running planar floor area of the first housing part and covered by the second housing part,
   wherein the edge is an encircling edge in which pin-shaped contact elements are accommodated in glazings.

2. The control unit housing as recited in claim 1, which is for housing a transmission control module of a transmission of a motor vehicle.

3. The control unit housing as recited in claim 1, wherein the first housing part and the second, cover-shaped housing part are joined to each other in a continuous material manner forming a sealing.

4. The control unit housing as recited in claim 1, wherein the first housing part has a plurality of the at least one strain relief tab for accommodating mechanical stresses, at which a fastening to an extrusion is carried out.

5. The control unit housing as recited in claim 4, wherein the fastening is a riveting.

6. The control unit housing as recited in claim 4, wherein the pin-shaped contact elements are glazed perpendicularly in the edge and have electrical contacting to at least one lead frame surrounded by the extrusion.

7. The control unit housing as recited in claim 4, wherein the fastening relieves strain on electrical contacting between at least one lead frame and electrical contact elements from mechanical stresses.

8. The control unit housing as recited in claim 1, wherein the circuit carrier is accommodated in the first housing part forming a contact surface that makes a heat dissipation possible, or is applied onto a block made of metallic material that is accommodated in the first housing part.

9. The control unit housing as recited in claim 1, wherein a contact surface lies between the heat dissipation surface on the floor of the first housing part and at least one of the objects contacting the planar floor area in a plane in which fastening of a transmission control module takes place.

10. The control unit housing as recited in claim 1, wherein at least one of the circuit carrier and the at least one electronic component is electrically contacted to the contact elements via bonding connections.

11. The control unit housing as recited in claim 1, wherein the control unit housing is placed, via an adjusting spring, with its heat dissipation surface against at least one of the objects in order to reduce a gap width along a contact surface.

12. The control unit housing as recited in claim 8, wherein the circuit carrier is applied onto a block made of metallic material that is accommodated in the first housing part and wherein the block made of metallic material is electrically insulated in the first housing part.

13. A control unit housing, comprising:
    a first housing part having (i) a plurality of tabs at an encircling edge for accommodating mechanical stresses at which a fastening to an extrusion is carried out and (ii) pin-shaped contact elements glazed perpendicularly in the encircling edge that electrically contact at least one lead frame surrounded by the extrusion,
    a second, cover-shaped housing part, and
    a circuit carrier having at least one electronic component being accommodated in the first housing part,
    wherein (i) the first housing part is designed in the shape of a tub and formed from a single piece of sheet steel having a floor which is designed as a heat dissipation surface between two objects contacting opposite sides of the planar floor area, (ii) the control unit housing is placed, via an adjusting spring, with its heat dissipation surface against the additional housing in order to reduce a gap width along a contact surface, and (iii) the circuit carrier is applied onto a block made of metallic material that is accommodated in the first housing part and wherein the block made of metallic material is electrically insulated in the first housing part.

14. A control unit housing, comprising:
    a first housing part in the shape of a tub formed from a single piece of sheet steel having an evenly running planar floor area designed as a heat dissipation surface between two objects contacting opposite sides of the planar floor area and having an edge extending along a circumference of the first housing part that includes at least one strain relief tab for absorbing mechanical tensile loads when fastened to an extrusion,
    a second, cover-shaped housing part,
    a circuit carrier having at least one electronic component and affixed directly to the evenly running planar floor area of the first housing part and covered by the second housing part, and
    a contact pin situated in a glazing along the edge and extending perpendicular to a flat surface of the edge, wherein the at least one electronic component is electrically contacted to the circuit carrier which is electrically contacted to the contact pin.

15. The control unit housing according to claim 14, wherein the circuit carrier is electrically contacted to the contact pin by a bonding connection that is not stressed mechanically by tension or bending.

* * * * *